United States Patent [19]

Ikeda et al.

[11] Patent Number: 5,080,927
[45] Date of Patent: Jan. 14, 1992

[54] TIN THIN FILM FORMATION METHOD

[75] Inventors: Koichi Ikeda; Masahiko Maeda; Yoshinobu Arita, all of Kanagawa, Japan

[73] Assignee: Nippon Telegraph and Telephone Corp., Tokyo, Japan

[21] Appl. No.: 549,593

[22] Filed: Jul. 6, 1990

[30] Foreign Application Priority Data

Jul. 7, 1989 [JP] Japan .................. 1-174129

[51] Int. Cl.⁵ .................. B05D 3/06; B05D 5/12; C01B 21/08; C01B 21/076
[52] U.S. Cl. .................. 427/53.1; 427/54.1; 427/126.1; 423/440; 423/410; 423/411
[58] Field of Search .................. 427/53.1, 54.1, 126.1, 427/99; 423/440, 410, 411

[56] References Cited

U.S. PATENT DOCUMENTS

| | | | |
|---|---|---|---|
| 4,434,189 | 2/1984 | Zaplatynsky | 427/53.1 |
| 4,446,242 | 5/1984 | Holt | 423/406 |
| 4,812,301 | 3/1989 | Davidson et al. | 423/440 |
| 4,867,223 | 9/1989 | Matsumura et al. | 427/53.1 |
| 4,889,745 | 12/1989 | Sata | 427/12 |

Primary Examiner—Norman Morgenstern
Assistant Examiner—Marianne L. Padgett
Attorney, Agent, or Firm—Blakely, Sokoloff Taylor and Zafman

[57] ABSTRACT

A thin film formation method includes the steps of holding a substrate in a reduced-pressure vapor phase reaction chamber having means for irradiating light in visible and ultraviolet ranges, supplying an organo-titanium compound containing a tri-azo group, and vapor-depositing a titanium nitride film on a surface of the substrate by an excitation reaction caused by light.

5 Claims, 1 Drawing Sheet

TIN THIN FILM FORMATION METHOD

BACKGROUND OF THE INVENTION

The present invention relates to a thin film formation method and, more particularly, to a method of forming a high-quality titanium nitride film which can be suitably used as a conductor film in a semiconductor device or the like.

Conventionally, a thermal CVD method is generally performed in order to form a titanium nitride film on a substrate. In this method, titanium tetrachloride ($TiCl_4$) and nitrogen ($N_2$), ammonia ($NH_3$), or the like are used as source material and heated up to a high temperature of 800° C. or more to be chemically vapor-deposited. In recent years, extensive studies aiming at applying a titanium nitride film to a semiconductor device have been made, and a method of forming a film at a substrate temperature of about 600° C. is proposed in, e.g., U.S. Pat. No. 4,570,328. In this film formation method using a source gas ($TiCl_4$), however, chlorine atoms having corrosiveness cannot be prevented from being mixed in a formed titanium nitride film. Therefore, it is difficult to apply the method to a semiconductor manufacturing process.

A method of forming a titanium nitride film at a comparatively low temperature is proposed in, e.g., Japanese Patent Publication No. 57-42970. The proposed method is a plasma CVD method in which an RF magnetic field is applied in a vapor phase reaction chamber to decompose and vapor-deposit an organo-titanium compound in a plasma. If this material is used, however, high-temperature reaction conditions are required in this CVD method using only a thermal reaction. In addition, in the plasma CVD method, an organo-titanium compound as a source material is decomposed into carbon (C) or the like as its component, and this decomposed carbon is mixed as an impurity in a formed titanium nitride film. Therefore, it is difficult to form a titanium nitride film with high purity and quality.

As described above, in the conventional thermal CVD method or plasma CVD method, reaction conditions require a high temperature, or a source material is decomposed into carbon or the like as its component and this decomposed carbon is mixed as an impurity in a formed titanium nitride film. Therefore, a high-quality titanium nitride film cannot be formed.

SUMMARY OF THE INVENTION

It is, therefore, an object of the present invention to solve the above conventional problems and provide a thin film formation method which can form a titanium nitride film with very high quality even under low-temperature, low-pressure reaction conditions.

In order to achieve the above object of the present invention, there is provided a thin film formation method comprising the steps of holding a substrate in a reduced-pressure vapor phase reaction chamber having means for irradiating light in visible and ultraviolet ranges, supplying an organo-titanium compound containing a tri-azo group, and depositing a titanium nitride film on a surface of the substrate by an excitation reaction caused by light.

The thin film formation method of the present invention is a thin film formation technique in which an organo-titanium compound containing a tri-azo group ($-N_3$) as a source material is decomposed by using a chemical reaction on the basis of an excitation process caused by light in visible and ultraviolet ranges. Therefore, a high temperature required in a thermal CVD method as a prior art depending on only thermal excitation is not necessary. In addition, unlike in a plasma CVD method, a by-product such as C (carbon) produced by decomposition of a source material is not mixed as an impurity in a formed film. As a result, a high-quality titanium nitride film with very high purity can be formed.

A source material for use in the thin film formation method of the present invention is an organo-titanium compound having a tri-azo group ($-N_3$) Preferred examples of the organo-titanium compound are biscyclopentadienyltitanium diazide [$Cp_2Ti(N_3)_2$] represented by the following formula (a) and an organo-titanium compound represented by the following formula (b) or (c) in which a substituting group of an alkyl group such as a methyl group is added to a cyclopentadienyl group (Cp group):

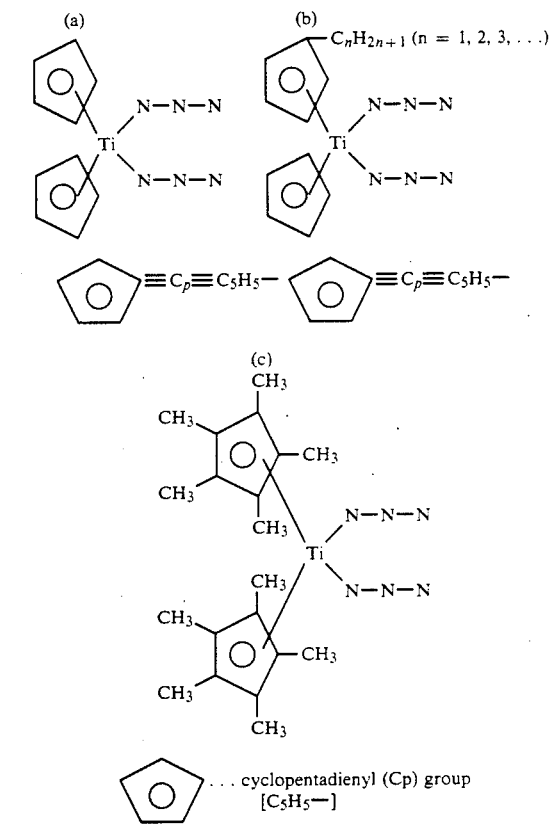

In the thin film formation method of the present invention, an example of an organo-titanium compound containing a tri-azo group for use in formation of a titanium nitride film is represented by the above formula (a). Although $Cp_2Ti(N_3)_2$ is not perfectly ionic, a tri-azo group is bonded to titanium by the following electron structure:

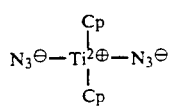

A tri-azo group has the following electron resonance structure:

When a molecular visible and ultraviolet light absorption spectrum of this compound is measured, an absorption peak is present near a wavelength of 410 nm in addition to an absorption peak in an ultraviolet range. This absorption peak near 410 nm is assumed to be obtained since an effect of a tri-azo group ($-N_3$) as a substituting group in the above molecule has a large influence on the molecule-electron structure. That is, when a tri-azo group is bonded to titanium and present in a molecule, it is excited in a preferable excited state with respect to a CVD reaction if light absorption is caused in the molecule. As a result, a Ti—Cp bond is ruptured and unstable $N_3$ is decomposed, and a titanium nitride (TiN) film is assumed to be formed by one of the following two mechanisms.

(1) A Ti—N bond of a source material is not ruptured but left to form a TiN film.

(2) Ti and N atoms produced in a reaction chamber upon decomposition are recombined to form a TiN film.

DETAILED DESCRIPTION OF THE PREFERRED EMBODIMENTS

The present invention will be described in detail below by way of its examples with reference to the accompanying drawings.

EXAMPLE 1

Figure 1:
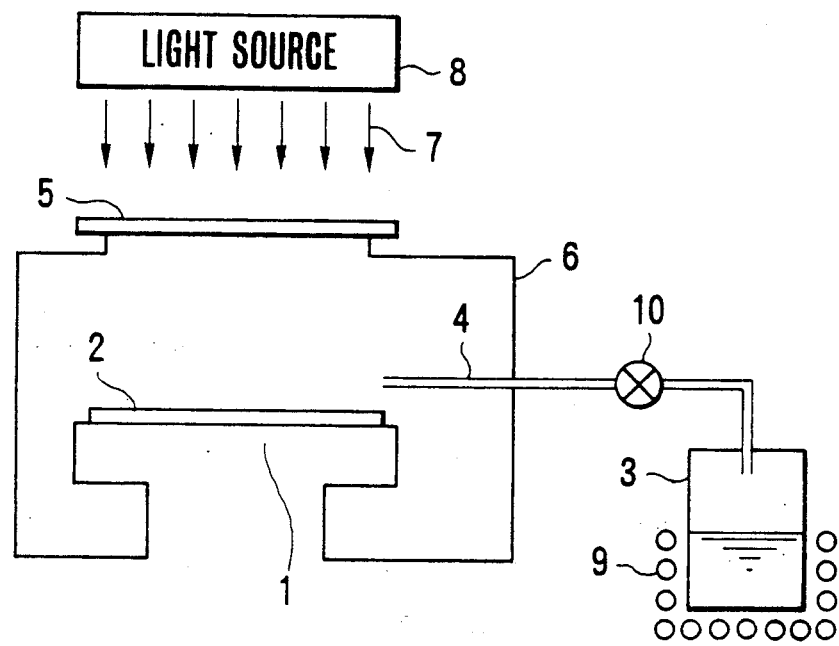
FIG. 1 is a schematic view showing a practical arrangement of a film formation apparatus for practicing a thin film formation method according to an embodiment of the present invention.

FIG. 1 schematically shows a practical arrangement of a film formation apparatus used in thin film formation according to the present invention. Referring to FIG. 1, an Si substrate 2 is arranged on a substrate holder 1 which can be heated up to a temperature of 100° C. to 500° C. Biscyclopendadienyltitanium diazide [$CP_3Ti(N_3)_2$] as a source material is filled in a material vessel 3. The material vessel 3 is heated to gasify the source material to produce a source gas, and the produced source gas is supplied onto the Si substrate 2 in a reaction chamber 6 via a material supply tube 4. In order to prevent an organic metal compound gas produced by gasification in the material vessel 3 from being cooled to be condensed or solidified in the material supply tube 4, the material supply tube 4 is arranged to heat and thermally insulate the source gas. For example, biscyclopendadienyltitanium diazide is sublimated to be a gas at a temperature of 130° C. to 150° C. at a vacuum degree of about 10 Pa.

Figure 2:
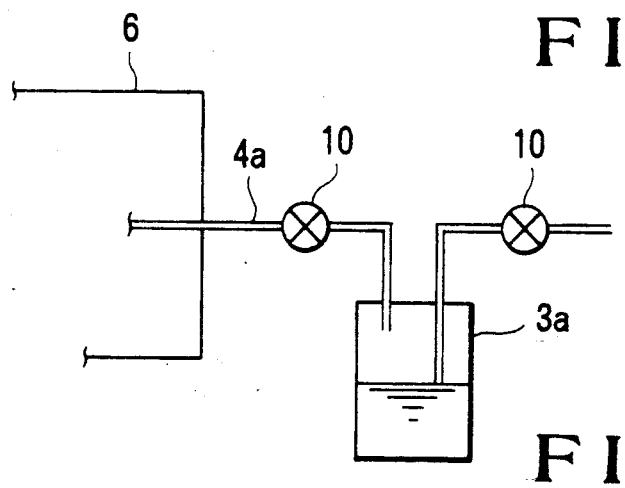
FIG. 2 is a schematic view showing a practical arrangement of a structure for supplying a source material into a reaction chamber of the film formation apparatus according to the embodiment of the present invention.

FIG. 2 shows a practical arrangement of a structure of a portion for supplying a source material into the reaction chamber 6. Referring to FIG. 2, biscyclopentadienyltitanium diazide gas produced by gasification in the material vessel 3a can also be supplied into the reaction chamber 6 by using a carrier gas such as argon or nitrogen gas.

The Si substrate 2 arranged in the reaction chamber 6 is irradiated with ultraviolet light 7 generated by a high-pressure mercury-arc lamp 8 through a window for irradiating ultraviolet light formed in an upper portion of the reaction chamber 6. Biscyclopentadienyltitanium diazide is supplied onto the Si substrate 2 irradiated with the ultraviolet light 7 to cause a photochemical reaction, and titanium nitride is deposited on the Si substrate 2. As the ultraviolet light 7, ultraviolet light having a good monochromatic property such as laser light can be used, as a matter of course.

The results obtained by forming a titanium nitride film by using the film formation apparatus having the above arrangement and supplying a material by using a carrier gas as shown in FIG. 2 will be described below. A substrate temperature was set at 400° C., and argon gas was used as a carrier gas and flowed at a flow rate of 10 SCCM. A pumping rate was adjusted to set the pressure in the reaction chamber at 3 Pa. The material vessel containing biscyclopentadienyl diazide was heated up to 120° C., and supply of the material into the reaction chamber was started. Deposition of titanium nitride was started at the same time light irradiation was started onto the reaction chamber and stopped when irradiation was stopped. The deposition rate was 5 nm/min. and the resistivity of the film was 240 $\mu\Omega$cm.

Although carbon atoms were mixed in a formed film when an organic metal material is used, only about 3% of carbon atoms were mixed in the film formed as described above. This carbon concentration largely depends on the substrate temperature upon film formation. That is, the carbon concentration was increased as the deposition temperature was decreased.

In addition, even when film formation was performed at a low temperature of the Si substrate 2 of 200° C. which could not be set in a film formation method based on CVD of a conductor film, a titanium nitride film having good conductivity was obtained.

EXAMPLE 2

In the thin film formation method of Example 1, an organo-titanium compound having a molecular structure represented by the above formula (b) or (c) in which a substituting group such as a methyl group was added to a cyclopentadienyl group (Cp group) as an organic metal source material. As a result, the same effect as that in Example 1 was obtained. That is, since a sublimation temperature of a material compound can be controlled by arbitrarily selecting the material compound, film formation can be performed under optimum chemical vapor deposition conditions.

Note that an additional substituting group is not limited to a methyl group in the organo-titanium compound used in this example. That is, any organic metal compound having a bond between a tri—azo group and Ti can be preferably used in formation of a thin film according to the present invention to achieve the above effect as that in this example.

As has been described above in detail, in the thin film formation method of the present invention, a material excitation reaction caused by light in visible and ultraviolet ranges is used to enable formation of a high quality titanium nitride film even under low-temperature, low-pressure reaction conditions. Therefore, according to the titanium nitride film formation method of the present invention, the following excellent effects can be obtained. (1) Since formation can be performed at a low temperature and a low pressure, a high-quality titanium nitride film can be formed on a material having only a low heat resistance. (2) Since the formed titanium nitride film has high quality, the titanium nitride film can be used as an electrode wiring material of a semiconductor device. That is, the titanium nitride film formation method of the present invention is a very effective thin film formation means.

What is claimed is:

1. A thin film formation method comprising the steps of:
   holding a substrate in a reduced-pressure vapor phase reaction chamber having means for irradiating light in visible and ultraviolet ranges;
   supplying an organo-titanium compound containing a tri-azo group; and
   depositing a titanium nitride film on a surface of said substrate by an excitation reaction caused by light.

2. A method according to claim 1, wherein a carrier gas is supplied together with the organo-titanium compound containing a tri-azo group.

3. A method according to claim 1, wherein the organo-titanium compound containing a tri-azo group is biscyclopentadienyltitanium diazide [$Cp_2Ti(N_3)_2$] represented by the following formula (a):

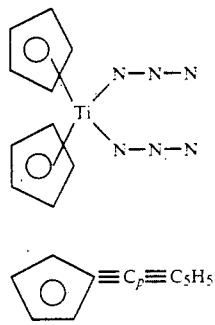

(a)

4. A method according to claim 1, wherein the organo-titanium compound containing a tri-azo group is an organo-titanium compound represented by the following formula (b) in which a substituting group of an alkyl group is added to cyclopentadienyl group (Cp group):

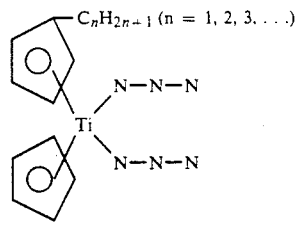

(b)

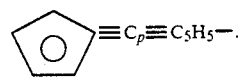

5. A method according to claim 1, wherein the organo-titanium compound containing a tri-azo group is an organo-titanium compound represented by the following formula (c) in which a substituting group of a methyl group is added to cyclopentadienyl group (Cp group):

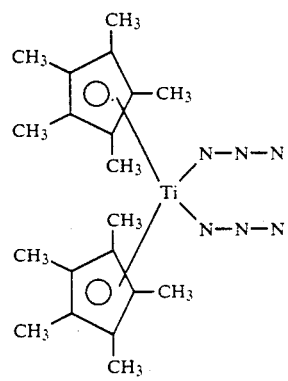

(c)

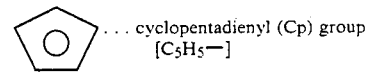

* * * * *

UNITED STATES PATENT AND TRADEMARK OFFICE
CERTIFICATE OF CORRECTION

PATENT NO. : 5,080,927
DATED : January 14, 1992
INVENTOR(S) : Ikeda et al.

It is certified that error appears in the above-identified patent and that said Letters Patent is hereby corrected as shown below:

Col. 1, line 14, insert --a-- after "as";

Col. 2, line 12, insert --.-- after "(-N$_3$)";

In Col. 2, change formula (a) from:

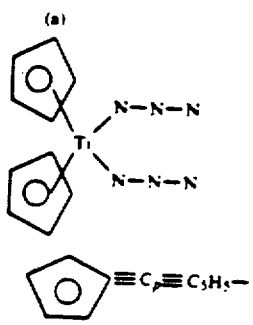

to:

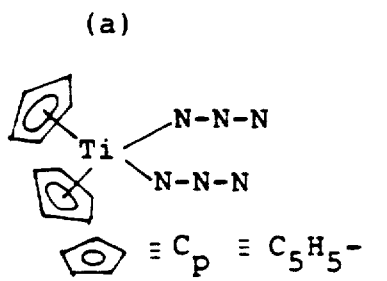

UNITED STATES PATENT AND TRADEMARK OFFICE
CERTIFICATE OF CORRECTION

PATENT NO. : 5,080,927

DATED : January 14, 1992

INVENTOR(S) : Ikeda et al.

It is certified that error appears in the above-indentified patent and that said Letters Patent is hereby corrected as shown below:

Col. 2, change formula (b) from:

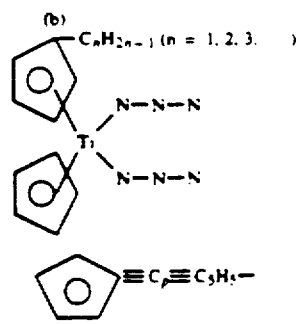

to:

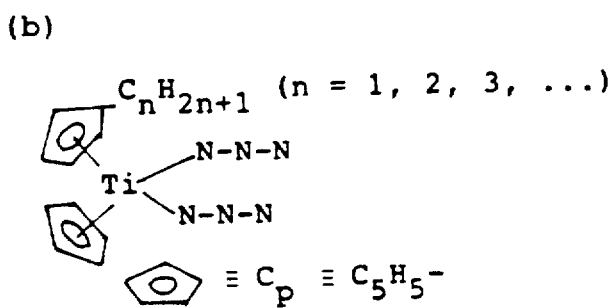

UNITED STATES PATENT AND TRADEMARK OFFICE
CERTIFICATE OF CORRECTION

PATENT NO. : 5,080,927

DATED : January 14, 1992

INVENTOR(S) : Ikeda et al.

It is certified that error appears in the above-indentified patent and that said Letters Patent is hereby corrected as shown below:

Col. 2, change formula (c) from:

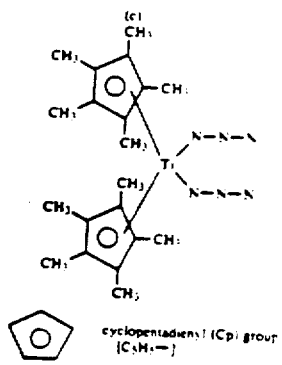

to:

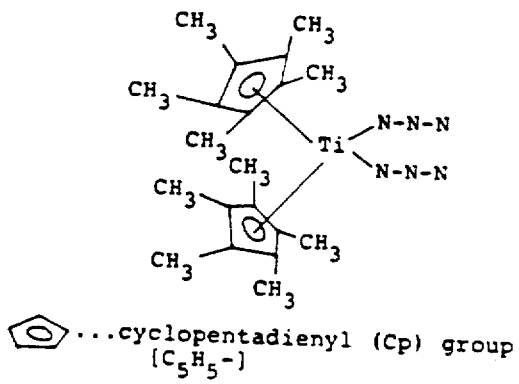

UNITED STATES PATENT AND TRADEMARK OFFICE
CERTIFICATE OF CORRECTION

PATENT NO. : 5,080,927
DATED : January 14, 1992
INVENTOR(S) : Ikeda et al.

It is certified that error appears in the above-indentified patent and that said Letters Patent is hereby corrected as shown below:

Col. 3, line 2, change "$-N=N^{\oplus}=N^{\ominus}:\leftrightarrow -N^{61}-N^{\ominus}\equiv N$" to
--- $-N=N^{\oplus}=N^{\ominus}:\leftrightarrow -N^{\ominus}-N^{\oplus}\equiv N$ --

Col. 5, change formula (a) from:

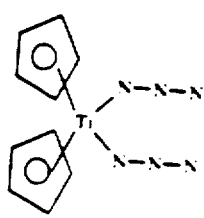

(a)

to:

(a)

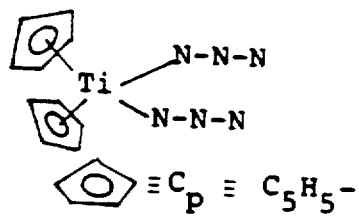

UNITED STATES PATENT AND TRADEMARK OFFICE
CERTIFICATE OF CORRECTION

PATENT NO. : 5,080,927
DATED : January 14, 1992
INVENTOR(S) : Ikeda et al.

It is certified that error appears in the above-indentified patent and that said Letters Patent is hereby corrected as shown below:

Col. 6, change formula (b) from:

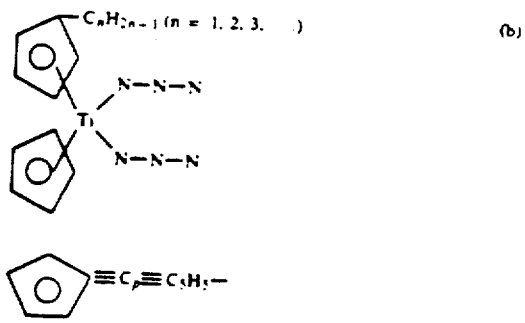

to:

(b)

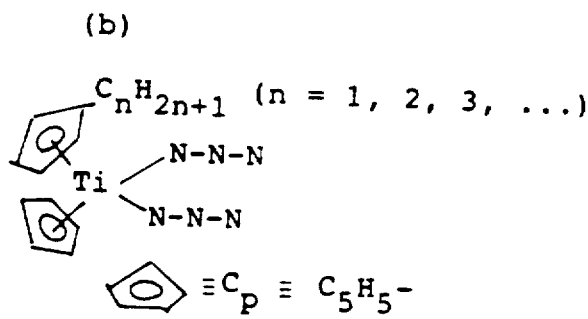

UNITED STATES PATENT AND TRADEMARK OFFICE
CERTIFICATE OF CORRECTION

PATENT NO. : 5,080,927   Page 6 of 7
DATED : January 14, 1992
INVENTOR(S) : Ikeda et al.

It is certified that error appears in the above-indentified patent and that said Letters Patent is hereby corrected as shown below:

Col. 6, change formula (c) from:

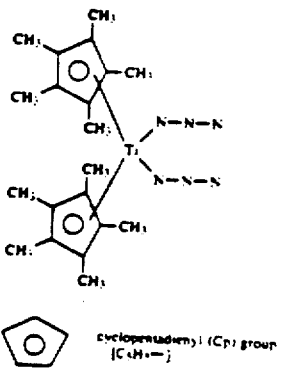

UNITED STATES PATENT AND TRADEMARK OFFICE
CERTIFICATE OF CORRECTION

PATENT NO. : 5,080,927
DATED : January 14, 1992
INVENTOR(S) : Ikeda et al.

It is certified that error appears in the above-indentified patent and that said Letters Patent is hereby corrected as shown below:

to:

(c)

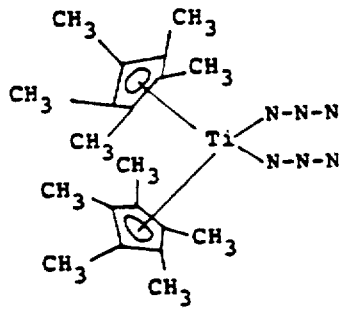

Signed and Sealed this

Sixth Day of June, 1995

Attest:

BRUCE LEHMAN

Attesting Officer    Commissioner of Patents and Trademarks